United States Patent
Lexa et al.

(10) Patent No.: US 10,192,007 B2
(45) Date of Patent: Jan. 29, 2019

(54) SYSTEM AND METHOD FOR ESTIMATING MATERIAL DENSITY

(71) Applicant: General Electric Company, Schenectady, NY (US)

(72) Inventors: Michael Anthony Lexa, Niskayuna, NY (US); Meena Ganesh, Niskayuna, NY (US); John Brandon Laflen, Niskayuna, NY (US); John Edward Smaardyk, Niskayuna, NY (US); Donald Kenney Steinman, Missouri City, TX (US)

(73) Assignee: General Electric Company, Schenectady, NY (US)

( * ) Notice: Subject to any disclaimer, the term of this patent is extended or adjusted under 35 U.S.C. 154(b) by 1090 days.

(21) Appl. No.: 14/561,662

(22) Filed: Dec. 5, 2014

(65) Prior Publication Data

US 2016/0162610 A1   Jun. 9, 2016

(51) Int. Cl.
*G01V 5/04* (2006.01)
*G01V 5/12* (2006.01)
*G06F 17/18* (2006.01)
*G06F 17/50* (2006.01)

(52) U.S. Cl.
CPC .......... *G06F 17/5009* (2013.01); *G01V 5/045* (2013.01); *G01V 5/12* (2013.01); *G01V 5/125* (2013.01); *G06F 17/18* (2013.01)

(58) Field of Classification Search
CPC .................................................. G06F 17/5009
USPC .......................................................... 703/6
See application file for complete search history.

(56) References Cited

U.S. PATENT DOCUMENTS

| | | |
|---|---|---|
| 4,587,423 A | 5/1986 | Boyce |
| 4,950,892 A | 8/1990 | Olesen |
| 8,311,789 B2 | 11/2012 | Eyvazzadeh et al. |
| 8,527,204 B2 | 9/2013 | Yin et al. |
| 2010/0017134 A1 | 1/2010 | Steinman et al. |
| 2012/0119077 A1 | 5/2012 | Smaardyk et al. |
| 2013/0009049 A1 | 1/2013 | Smaardyk et al. |

(Continued)

FOREIGN PATENT DOCUMENTS

WO   2009006332 A2   1/2009

OTHER PUBLICATIONS

Hertzog et al., "Gravel-Pack Imaging (GPI)Tool: Precise and Accurate Knowledge of Gravel-Pack Integrity", Society of Petroleum Engineers,SPE 135060, OnePetro, 2010, 10 Pages.

(Continued)

*Primary Examiner* — Hugh M Jones
(74) *Attorney, Agent, or Firm* — GE Global Patent Operation

(57) ABSTRACT

A method implemented using one or more computer processors for estimating the density of a material in an annular space includes receiving detector data representative of scattered photons resulting from interaction of a material in an annular space with radiation from a radiation source and detected by a plurality of radiation detectors. The technique further includes performing a set of Monte Carlo simulations. The method further includes performing a principal component analysis on the set of Monte Carlo simulations to generate a principal component analysis model of the detector data. The method also includes estimating the density of the material at one or more locations within the annular space based upon the principal component analysis model and the detector data.

20 Claims, 7 Drawing Sheets

(56) References Cited

U.S. PATENT DOCUMENTS

2013/0261974 A1    10/2013    Stewart et al.
2013/0268200 A1    10/2013    Nikitin

OTHER PUBLICATIONS

Fisher et al., "Gravel-Pack Evaluation Using a Memory Gamma-Gamma Density Tool", Society of Petroleum Engineers, SPR 58779, OnePetro, 2000, 13 Pages.

Guo et al., "Natural Gamma-ray Log Interpretation: Semi-empirical, Principal Components Analysis, and Monte Carlo Multiply-scattered Components Approaches", Nucl, Geophys, vol. No. 9 Issue No. 4, pp. 305-318, 1995.

Bonifazzi et al., "Principal Component Analysis of Large Layer Density in Compton Scattering Measurements", Applied Radiation and Isotopes, vol. No. 53, pp. 571-579, 2000.

Varley et al., "Development of a Neural Network Approach to Characterise 226Ra Contamination at Legacy Sites Using Gamma-Ray Spectra Taken From Boreholes", Journal of Environmental Radioactivity, vol. No. 140, pp. 130-140, 2015.

PCT Search Report and Written Opinion issued in connection with corresponding Application No. PCT/US2015/063357 dated Feb. 26, 2016, 13 pp.

PCT Search Report and Written Opinion issued in connection with related Application No. PCT/US2015/063401 dated Feb. 26, 2016, 13 pp.

SYSTEM AND METHOD FOR ESTIMATING MATERIAL DENSITY

BACKGROUND

The invention relates generally to monitoring the conditions in a borehole of a subterranean well. Specifically, the invention is related to techniques for estimating material density within the annular space of a subterranean well.

Subterranean areas of interest beneath the surface are accessed through a borehole. The boreholes are surrounded by subterranean material, such as sand, that may migrate out of the boreholes with the oil, gas, water, and/or other fluids produced by the wells. A casing is inserted in a borehole and is held into place by cementing space between the outer surface of the casing and the surrounding earth. The borehole may also include other piping such as production tubing, and inner casing, and conductor casing inside the outermost casing. The fluid produced from the well flows to the surface through the production tubing. During the life of a subterranean well, the production tubing may have to be removed for repair and maintenance activities. There may also be a need to remove a portion or all of one or more of the other piping of the subterranean well.

The presence of sand and other particulate material may affect the functioning of various producing equipment, such as tubing, pumps, and valves. The particulate material may partially or fully clog the well thus reducing the fluid production capabilities of the wells. Maintenance of wells in such scenarios is expensive. The presence of the particulates in the hydrocarbon fluids from the wells necessitates additional processing at the surface thus increasing the cost of extraction of fluids.

Boreholes are suitably designed and constructed to prevent mixing of particulates with the fluids and are to be monitored for effectiveness of the design through the life of the well. Borehole design includes providing a perforated base pipe positioned proximate to the formation site of interest. A screen is disposed around the perforated base pipe and a coarse particulate material, such as sand, or proppants, which are typically sized and graded and collectively referred to as "gravel," is disposed in the subterranean well between the screen and the borehole. The formation fluid flows through the screen and the gravel in the pack prevents formation fines and sand from flowing into the borehole and mixing with the produced fluids.

Over time, both distribution and density of the gravel in the borehole annulus can change for various reasons. For example, finer sand or other such particulate materials may enter and block the screen openings. The material of the gravel pack may be non-uniformly distributed due to borehole conditions such as non-uniform flow rates. During the formation of the gravel pack or during the operation of the well over an extended period of time, void areas may be created in the material around the borehole. Non uniform material distribution around the borehole would increase the possibility of introduction of particulate materials in the extracted fluid.

During the production of the fluid, drilling fluids fill the annular space between the concentric pipes. Particulates within the drilling fluids may precipitate within the annular space between two successive concentric pipes. Over a longer period of time, such particulates along with fluid and oil, may form a cement like substance that couples together the concentric pipes. Such coupling prevents removal of the inner pipes from the wellbore. In some situations, cutting tools are used to sever the pipes to enable removal of the production tubular, inner casing or other pipes. The pipes are to be cut at a depth above where the coupling is preventing the removal of the pipes.

The material of the borehole annulus is to be monitored continuously for effective prevention of mixing of the particulate materials with the fluid. Accurate estimation of material density in the annulus would help to foresee problems in the borehole and take effective steps at an optimal cost. There is a need to devise techniques for estimating the density of the material in the annulus in real time.

BRIEF DESCRIPTION

In one aspect of the present technique, a system for estimating the density of a material in an annular space is disclosed. The system includes a tool configured to be accommodated within and move within a channel of an inner conduit disposed within an outer conduit, the inner conduit and the outer conduit together defining an annular space containing a material characterized by one or more densities. The tool comprising a radiation source and a plurality of radiation detectors, the radiation detectors being configured to detect scattered photons resulting from interaction of the material in the annular space with radiation from the radiation source. The system further includes a data transmission device coupled to the plurality of detectors and configured to transmit detector data. The system also includes one or more computer processors linked to the data transmission device and configured to receive the detector data and generate a set of Monte Carlo simulations. The set of Monte Carlo simulations are generated based on the geometry of the inner and outer conduits, the composition of the inner and outer conduits, the relative location of the tool with respect to the inner and outer conduits, the geometry of the tool and a set of hypothetical materials of different densities. The one or more computer processors are further configured to perform a principal component analysis on the set of Monte Carlo simulations to generate a principal component analysis model of the detector data. The one or more computer processors are also configured to apply the principal component analysis model to the detector data to estimate the density of the material in the annular space at one or more locations within the annular space based upon the principal component analysis model and the detector data.

In another aspect of the present technique, a method implemented by one or more computer processors for estimating the density of a material in an annular space is disclosed. The method includes receiving detector data representative of scattered photons resulting from interaction of a material in an annular space with radiation from a radiation source and detected by a plurality of radiation detectors. The radiation source and the plurality of radiation detectors are part of a tool configured to be accommodated within and move within a channel of an inner conduit disposed within an outer conduit, the inner conduit and the outer conduit together defining the annual space. The set of Monte Carlo simulations are based on the geometry of the inner and outer conduits, the composition of the inner and outer conduits, the relative location of the tool with respect to the inner and outer conduits, the geometry of the tool and a set of hypothetical materials of different densities filling the annular space and the space inside the inner conduit. The method further includes performing a principal component analysis on the set of Monte Carlo simulations to generate a principal component analysis model of the detector data and applying the principal component analysis model to the detector data. The method also includes estimating the density of the material in the annular space at one or more locations within the annular space based upon the principal component analysis model and the detector data.

In another aspect of the present technique, a non-transitory computer readable medium having instructions is disclosed. The instructions enable one or more computer processors to receive detector data representative of scattered photons resulting from interaction of a material in an annular space with radiation from a radiation source and detected by a plurality of radiation detectors. The radiation source and the plurality of radiation detectors are part of a tool configured to be accommodated within and move within a channel of an inner conduit disposed within an outer conduit, the inner conduit and the outer conduit together defining the annual space. The instructions further enable the one or more computer processors to perform a set of Monte Carlo simulations based on the geometry of the inner and outer conduits, the composition of the inner and outer conduits, the relative location of the tool with respect to the inner and outer conduits, the geometry of the tool and a set of hypothetical materials of different densities filling the annular space and the space inside the inner conduit. The instructions further enable the one or more computer processors to perform a principal component analysis on the set of Monte Carlo simulations to generate a principal component analysis model of the detector data. The instructions further enable the one or more computer processors to apply the principal component analysis model to the detector data and estimate the density of the material in the annular space at one or more locations within the annular space based upon the principal component analysis model and the detector data.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Embodiments discussed herein disclose a system and a method for estimating density of a material in an annular space using a logging tool. The annular space formed by an inner conduit and an outer conduit of the wellbore. Disclosed embodiments include receiving detector data representative of scattering events resulting from interactions of a material in the annular space with radiation from a radiation source and detected by a plurality of radiation detectors. The embodiments also include transmitting the detector data to one or more computer processors for determining the density of the annular material in specific locations. The embodiments also disclose techniques for determining one or more geometric variables associated with the annular space such as the angular location and the minimum gap of the logging tool. The one or more processors are configured for performing a set of Monte Carlo simulations based on the dimensions of the conduits, the composition of the conduits, the relative location of the tool with respect to the conduits, the geometry of the tool and a set of hypothetical materials of different densities filling the annular space and the space inside the inner conduit. The one or more processors are also configured for generating polynomial models of the detector data based on the set of Monte Carlo simulations and estimating the density of the material in the annular space at one or more locations within the annular space based upon the polynomial models and the detector data.

The term 'tool' used herein refers to a logging tool in a borehole of a subterranean well such as an oil well. The tool is designed and configured to acquire data related to the material in the annular space of the well. The term 'material' refers to drilling fluid and other particulates that precipitate out of the drilling fluid and other such substances encountered in the borehole environment. The term 'scattering events' refers to the inelastic scattering such as Compton scattering. The terms 'detector data' and 'count rate' refer to photon measurements acquired by the detectors of the scattering events in units of counts per unit time. The term 'well parameters' refers to dimensions of the borehole geometry and the radius of the tool. Specifically, the term 'well parameters' also include the dimensions of the conduits, the composition of the conduits, the relative location of the tool with respect to the conduits, the geometry of the tool and a set of hypothetical materials of different densities filling the annular space and the space inside the inner conduit. The term 'angular location' refers to the location of the tool relative to the inner conduit and is specified by angle 308 in FIG. 8. The term 'energy window' refers to a range of values of the energies of the detected photons.

Figure 1:
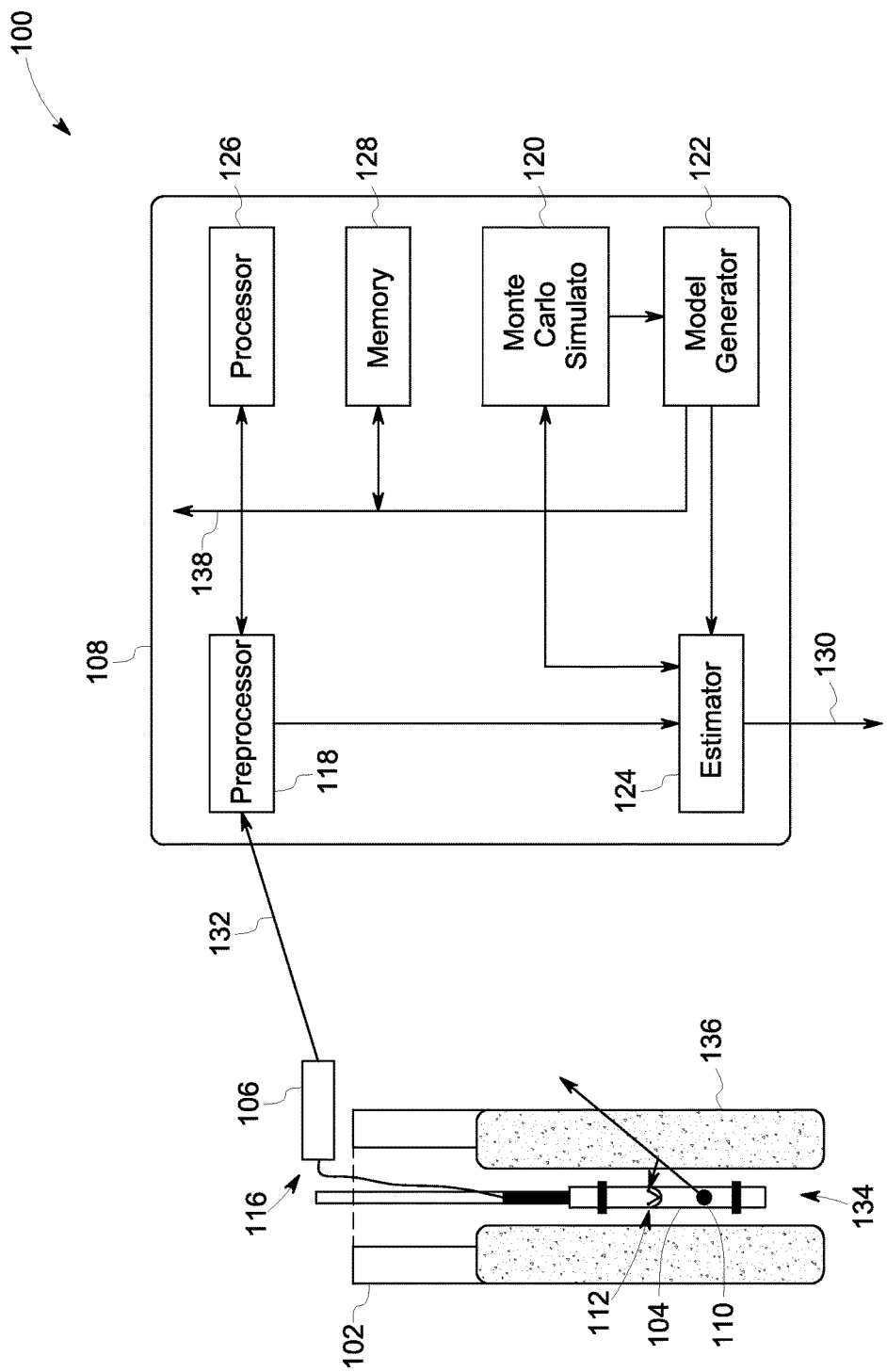
FIG. 1 illustrates a system for determining density of material in an annular space of the subterranean well in accordance with an exemplary embodiment.

FIG. 1 illustrates a subterranean well site 100 using a system 108 for determining density of material 136 within a borehole 102 in accordance with an exemplary embodiment. The well site 100 includes a tool 104 disposed in an annular space 134 of the borehole 102. The tool 104 for generating detector data 132 is explained in detail in a subsequent paragraph with reference to a subsequent figure. The annular space 134 has an inner conduit and an outer conduit containing materials 136 characterized by one or more densities. The tool 104 is configured to be accommodated within and move within a channel of the inner conduit disposed within the outer conduit. The tool comprises a radiation source 110 and a plurality of radiation detectors 112. The radiation source 110 in one embodiment is a gamma-ray source. The photons emitted by the radiation source 110 are directed to the material 136 and scattering events are generated from interaction of the material 136 in the annular space with radiation from the radiation source. The plurality of radiation detectors 112 are configured to detect the scattered photons and generate detector data 132.

A data transmission device 106 is coupled to the plurality of radiation detectors by electric cable 116 and configured to transmit detector data to the system 108. In an exemplary embodiment, the system 108 includes a preprocessor module 118, an estimator module 124, a Monte Carlo Simulator 120, a model generator 122, one or more computer processors 126, and a memory module 128. Embodiments of the disclosed technique store at least one of the modules 118, 120, 122, 124 in the memory module 128 and executed by the one or more computer processors 126. In some embodiments, at least one of the modules 118, 120, 122, 124 is a standalone hardware module co-operatively interacting with the other modules. The modules may be co-located in a same physical location or may be disposed in different locations interconnected by a communication link. In the illustrated embodiment, the communication bus 138 is a communications link establishing bi-lateral data transmission among modules, one or more processors 126, and the memory module 128. In other embodiments, the communication bus 138 may be a wired communication link or a wireless link.

The preprocessor module 118 is communicatively coupled to the transmission device 106 and configured to receive detector data 132 representative of density of the material in the annular space. The preprocessor module 118 is further configured to perform tool face correction. In one embodiment, the detector data is processed based on the tool face offset. In some embodiments, the preprocessor module 118 is configured to perform a low pass filtering of the detector data to reduce transient noise effects. The preprocessor module 118 may also perform various other signal conditioning operations on the detector data such as normalization, and rejection of outlier values.

The Monte Carlo Simulator 120 is communicatively coupled to the memory module 128 and is configured to retrieve the dimensions of the conduits, the composition of the conduits, the relative location of the tool with respect to the conduits, the geometry of the tool and a plurality of density values corresponding to a set of hypothetical materials of different densities filling the annular space and the space inside the inner conduit from the memory locations. The Monte Carlo Simulator 120 is further configured to generate a set of Monte Carlo simulations based on the information retrieved from memory. In exemplary embodiment the simulations are performed by using Monte Carlo N-Particle (MCNP) transport code to simulate the response of the tool. The MCNP code uses a plurality of parameters and a set of hypothetical material of different densities to generate a coarse response surface representative of the count response of the tool. The data generated by the Monte Carlo simulations is referred herein as Monte Carlo simulations data.

The model generator 122 is communicatively coupled to the Monte Carlo Simulator 120 and configured to generate a model for estimation of the density of the material in the annular space, the angular location, and the minimum gap. In one embodiment, the model generator is configured to approximate the coarse response surface by fitting a multivariate polynomial function. Specifically, the model generator 122 is configured to select a polynomial model and then solve for a plurality of coefficients of the polynomial model. The polynomial model is selected as a function of the density parameter, the angular location, and the minimum gap. In another embodiment, the model generator is configured to determine a projection operator based on the simulation data. The projection operator projects the detector data into a subspace having a model as a function of the density parameter of the material in the annular space. In one embodiment, the projection operator is determined based on the singular value decomposition of a matrix generated using the detector data. In alternative embodiments, other methods such as QR decomposition and linear regression techniques are used to determine the projection operator.

The estimator module 124 is communicatively coupled to the preprocessor module 118 and the model generator 122 and configured to generate an estimate of density value 130 for the material 136 in the annular space 134. In one embodiment, the estimator module 124 performs an optimization technique to generate an estimate of the density value 130. An objective function based on the polynomial model for the detector data is used in the optimization technique. In another embodiment, the estimator module 124 determines the density value based on a polynomial inversion operation. In one embodiment, the polynomial inversion operation is performed using a look up table stored in the memory module 128. The projected detector data is used to retrieve a density value using the look up table. The look up table stores pairs of values corresponding to the projected detector data and the density values.

The one or more processors 126 includes at least one arithmetic logic unit, a microprocessor, a general purpose controller or a processor array to perform the desired computations or run the computer program. In one embodiment, the functionality of the one or more processors 126 may be limited to acquire the detector data. In another embodiment, the functionality of the one or more processors 126 may be limited to perform Monte Carlo simulations. In another embodiment, the functionality of the one or more processors 126 is limited to model generation. In one embodiment, the functionality of the one or more processors 126 is limited to estimating the density value of the material. In some exemplary embodiments, functionality of the one or more processors 126 include one or more of the functions of the preprocessor module 118, the Monte Carlo Simulator module 120, model generator 122 and the estimator module 124. While the one or more processors 126 is shown as a separate unit, there can be a processor co-located or integrated in one or more of the modules 118, 120, 122, 124. Alternatively, the one or more processors 126 can be local or remote, such as a central server or cloud based, with the communications bus 138 can be wired, wireless or a combination thereof.

The memory module 128 may be a non-transitory storage medium. For example, the memory module 128 may be a dynamic random access memory (DRAM) device, a static random access memory (SRAM) device, flash memory or other memory devices. In one embodiment, the memory module 128 may include a non-volatile memory or similar permanent storage device, media such as a hard disk drive, a floppy disk drive, a compact disc read only memory (CD-ROM) device, a digital versatile disc read only memory (DVD-ROM) device, a digital versatile disc random access memory (DVD-RAM) device, a digital versatile disc rewritable (DVD-RW) device, a flash memory device, or other non-volatile storage devices. In one specific embodiment, a non-transitory computer readable medium may be encoded with a program to instruct the one or more processors 126 to generate a density value.

Figure 2:
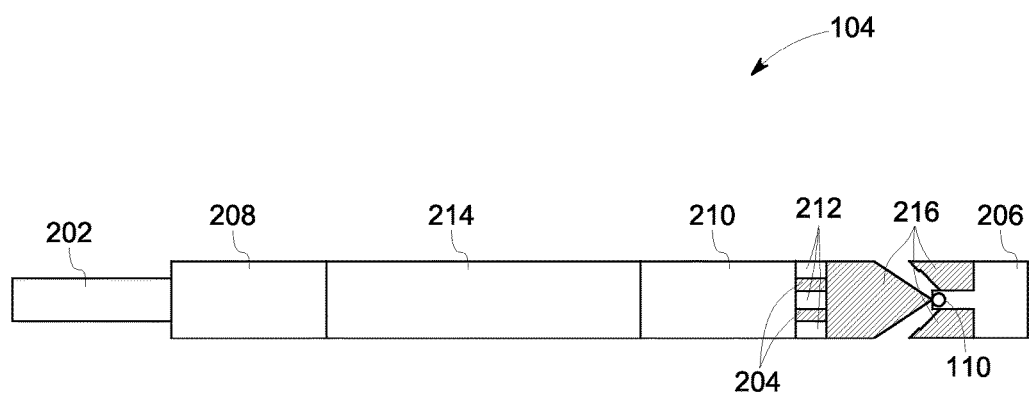
FIG. 2 illustrates a logging tool used for acquiring detector data in accordance with an exemplary embodiment.

FIG. 2 illustrates the logging tool 104 used for acquiring detector data in accordance with an exemplary embodiment. The tool includes an inclinometer 202, a plurality of collimators 204, 216 a source holder 206, a power system 208, detector electronics 210, a detector array 212, and tool electronics 214. The inclinometer 202 is used to orient the measurements within the borehole and is configured to operate with other completion logging measurements including multi-finger caliper, collar locator, and a basic production logging tool string. The collimator 204 provides azimuthal collimation so that detected data at each detector is independent of other detector outputs. The collimator 216 along with the source to detector spacing determines where the single Compton scattering events occur. The source holder 206 positions the radiation source 110. The detector array 212, and the tool electronics 214 are powered by the power system 208. The tool electronics 214 is configured to communicate with the up hole telemetry based logging system. The temperature rating of the tool electronics 214 and the detector array 212 operating in the down hole is set at a high value suitable for subterranean operation. In one embodiment, the temperature rating of the tool electronics 214 and the detector array 212 is one seventy five degree centigrade. The radiation source 110 provides gamma rays. The imaging tool 104 uses a well collimated, short-spaced source to detector array. Each of the plurality of detectors in the detector array 212 is capable of acquiring count rates of 400 kHz. The imaging tool 104 is configured to operate at a logging speed of 5 to 10 feet/minute with a vertical resolution of 2 inches. In one embodiment, the detector array includes six detectors in a 2.5 inch diameter pressure housing. The tool detects Compton-scattered gamma rays in an energy range of about 100 keV to about 662 keV. In one embodiment, the plurality of detectors in the detector array 212 are configured to detect gamma rays in three energy ranges. In one embodiment, spacing between the source to detector array and aperture of the plurality of collimators 204, 216 is adjusted to optimize void sensitivity of the tool for a variety of inner conduit diameters. For example, a shorter spacing is used for smaller diameter conduits and a longer spacing is used for larger diameter conduits.

Figure 3:
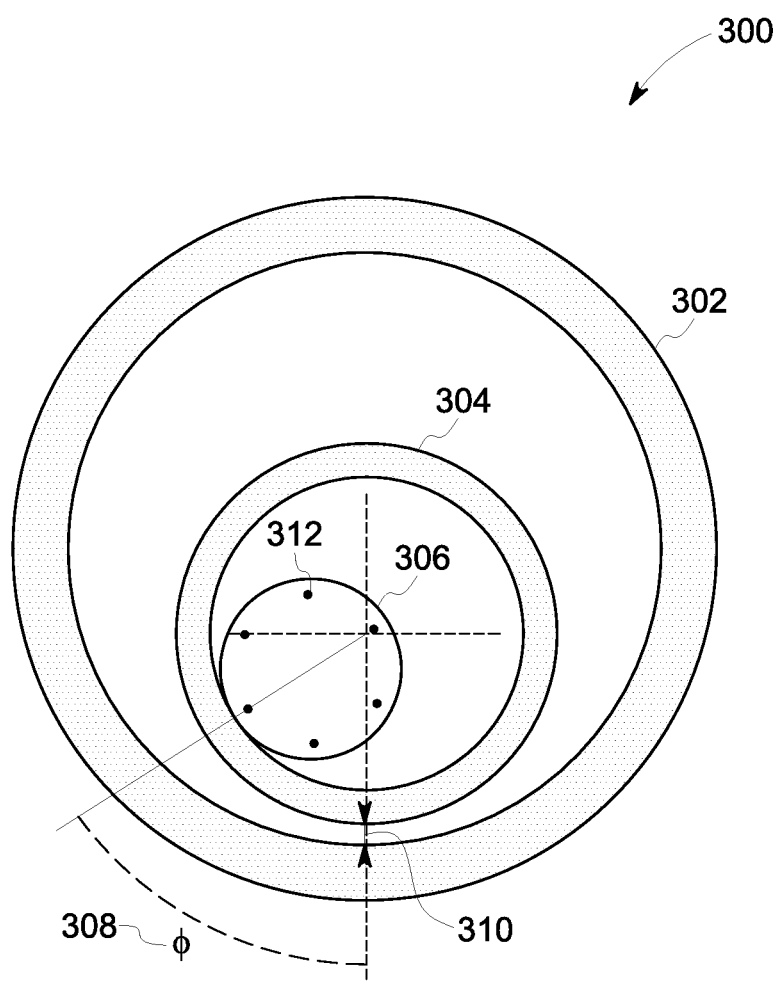
FIG. 3 is a schematic of a cross section of a borehole illustrating an angular tool position and a minimum gap between the outer conduit and inner conduit in accordance with an exemplary embodiment.

FIG. 3 is a schematic 300 of a cross section of a borehole illustrating tool position and the minimum gap between the outer conduit and inner conduit in accordance with an exemplary embodiment. The schematic 300 illustrates an outer conduit 302, an inner conduit 304 and the logging tool 306. Each of the outer conduit 302 and the inner conduit 304 has a corresponding inner surface and an outer surface. The dimensions of the borehole include dimensions of the outer conduit 302, dimensions of the inner conduit 304 and dimensions of the tool 306. The dimensions of the outer conduit include inner diameter and an outer diameter corresponding to inner surface and outer surface of the outer conduit 302. The dimensions of the inner conduit include an inner diameter and an outer diameter corresponding to the inner surface and outer surface of the inner conduit 304. The schematic 300 illustrates a minimum distance 310 between the outer conduit 302 and the inner conduit 304, which is referred herein as 'minimum gap'. Specifically, the minimum gap 310 is the distance between the outer surface of the inner conduit 304 and the inner surface of the outer conduit 302. The schematic 300 also illustrates an angular position 308 of the tool. The minimum distance 310 is denoted by symbol g and the angular position 308 is denoted by the symbol φ in the subsequent paragraphs. The plurality of dots 312 in the schematic 300 are representative of the plurality of detectors in the detector array 212 of FIG. 2.

Figure 4:
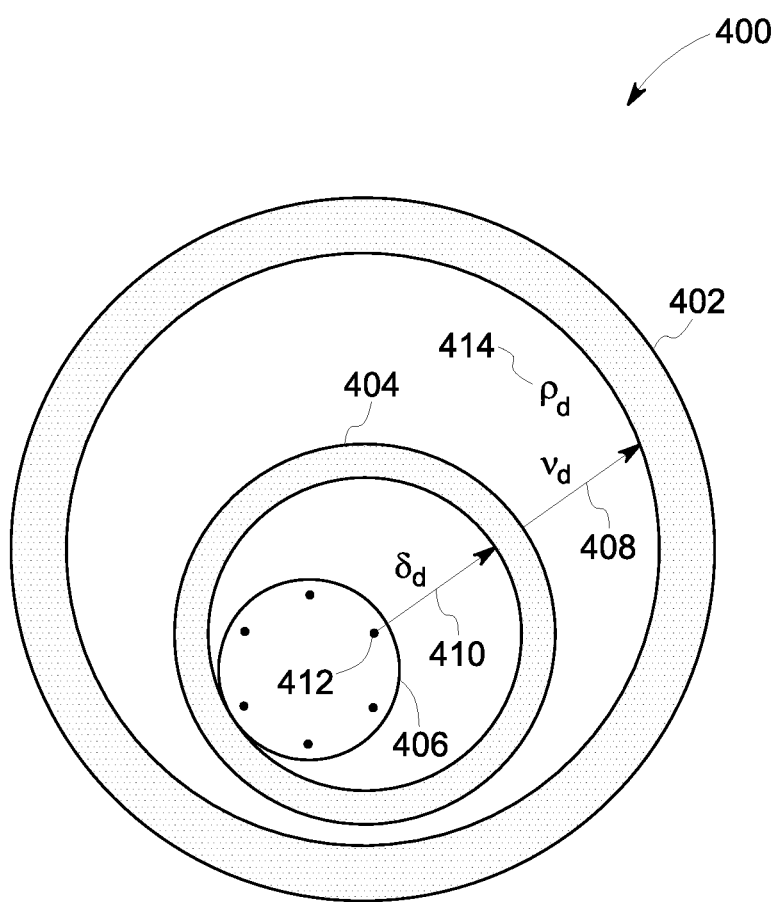
FIG. 4 is a schematic of a cross section of a borehole illustrating the model variables in accordance with an exemplary embodiment.

FIG. 4 is a schematic 400 of a cross section of a borehole illustrating the independent variables of the polynomial model in accordance with an exemplary embodiment. The schematic 400 illustrates an outer conduit 402, an inner conduit 404 and the tool 406 disposed within the inner conduit 404. The annular space between the inner conduit 404 and the outer conduit 402 has a material density represented by a symbol $\rho_d$. A plurality of dots inside the tool 406 are representative of six detectors. The schematic 400 illustrates the two radial distance variables of the polynomial model for one of the detectors. The first radial distance 410 is the distance from the detector 412 to the inner surface of the inner conduit 404. The second radial distance 408 is the distance from the outer surface of the inner conduit 404 to the inner surface of the outer conduit. The first radial distance 410 and the second radial distance 408 are specified with reference to the detector 412. In a similar way, the first radial distance and the second radial distance may be specified for each of the detector of the detector array of the tool 406. The distance 410 is represented herein by a symbol $\delta_d$ and the distance 408 is represented by a symbol $v_d$. Here, the subscript d is an index representative of the one of the six detectors. The distance $v_d$ is along the same radial line as the distance $\delta_d$. It should be noted herein that the first radial distance and the second radial distance are a function of the angular position of the tool φ in the borehole and the minimum gap g between the outer conduit 402 and the inner conduit 404.

Figure 5:
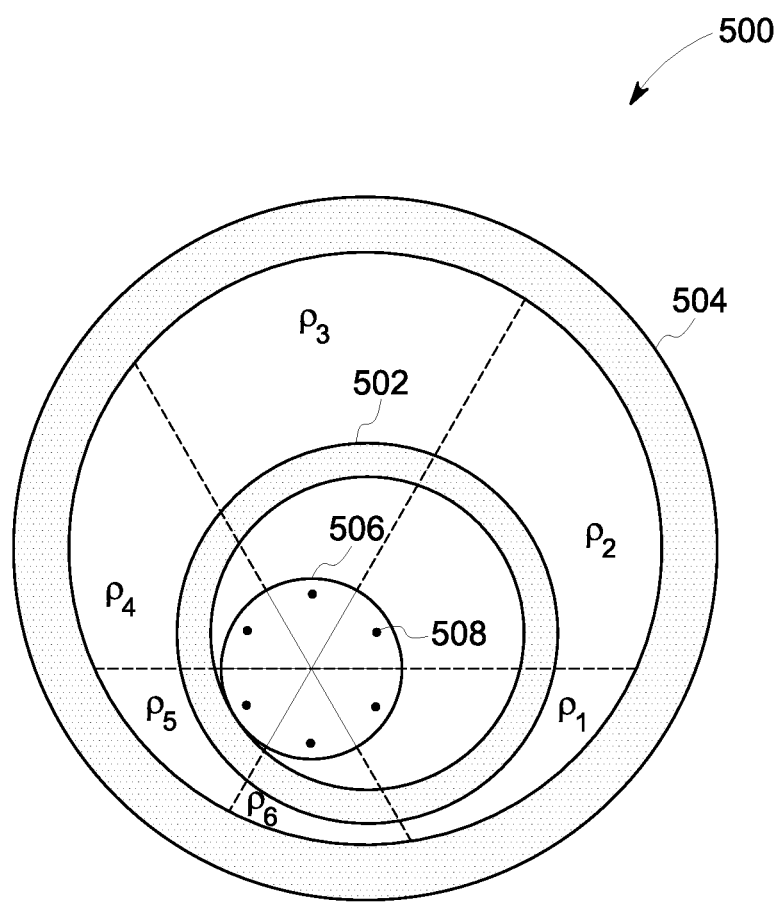
FIG. 5 is a schematic of a cross section of a borehole illustrating positions of a plurality of detectors in accordance with an exemplary embodiment.

FIG. 5 is a schematic 500 of a cross section of a borehole illustrating positions of a plurality of detectors in accordance with an exemplary embodiment. The plurality of detectors 508 are disposed symmetrically in the logging tool 506 within an inner conduit 502. The outer conduit 504 is also illustrated in the schematic 500. The plurality of detectors 508 are configured to detect gamma rays in three energy windows. In one exemplary embodiment, each of the plurality of detectors 508 detect gamma rays in a first energy window having a range of 73 keV to 183 keV, a second energy window having a range of 207 keV to 250 keV, and a third energy window having a range of 250 keV to 637 keV. The plurality of detectors are configured to detect count rate data in multiple energy windows simultaneously. The plurality of density of the material in the annular space corresponding to the plurality of detectors are denoted as $\rho_1$, $\rho_2$, $\rho_3$, $\rho_4$, and $\rho_6$.

Figure 6:
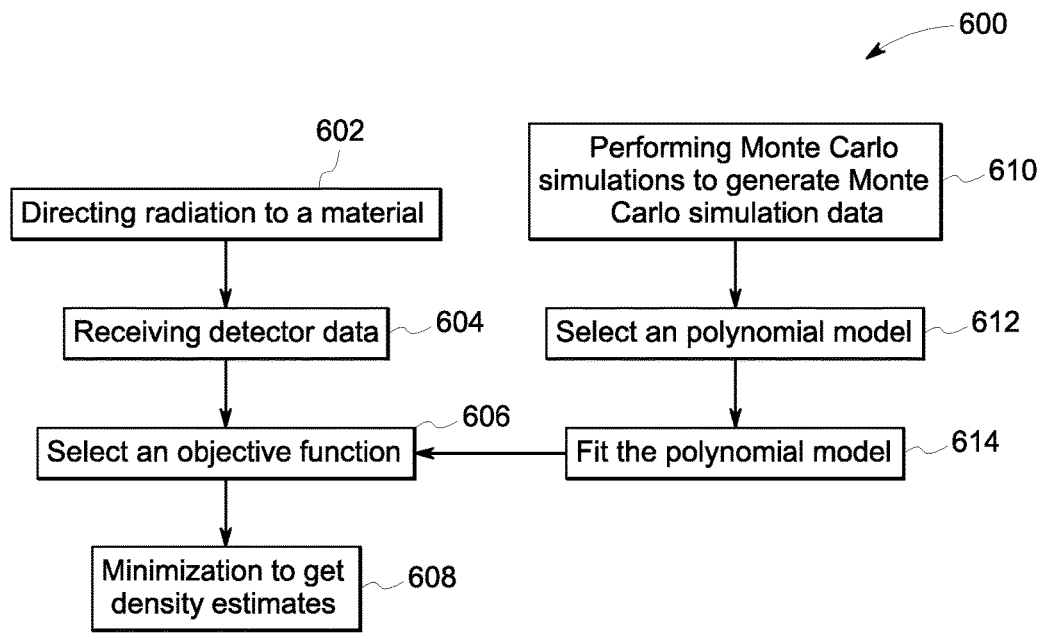
FIG. 6 is a flow chart of a method for estimating the density of the material using a polynomial model in accordance with an exemplary embodiment.

FIG. 6 illustrates a flowchart 600 of a method for estimating the density of the material using a polynomial model in accordance with an exemplary embodiment. The method includes directing radiation to a material in an annular space of the borehole of a subterranean well as illustrated in step 602. In an exemplary embodiment, the radiation is a gamma radiation. Scattering events are generated from interaction of the material in the annular space with radiation from the radiation source. The detector array having a plurality of detectors acquires the scattering events. The detector data is transmitted from the detector array to one or more computer processors 604. A set of Monte Carlo simulations are performed by the one or more processors to generate Monte Carlo simulation data 610. The set of Monte Carlo simulations are based on the dimensions of the conduits, the composition of the conduits, the relative location of the tool with respect to the conduits, the geometry of the tool and a set of hypothetical materials of different densities filling the annular space and the space inside the inner conduit. In one exemplary embodiment, the set of Monte Carlo simulations simulate the detector data corresponding to the geometry of the simulation and a set of hypothetical materials of different densities.

The method further includes modeling the detector data by a mathematical function. A polynomial function is selected as the mathematical object for modeling the detector data 612. In particular, the detected data is modeled by:

$$f_{i,d}(\rho_d, \delta_d, \upsilon_d) = \sum_{k=1}^{p} \sum_{l=0}^{k} \sum_{m=0}^{k-1} a_{lmn} \rho_d^l \delta_d^m \upsilon_d^n \qquad (1)$$

where, the detector data $f_{i,d}$ corresponds to detector d operating in an energy window i and n=k−l−m. The order of the polynomial is given by p, $\{\alpha_{lmn}\}$ are the coefficients of the polynomial and the independent variables are $\rho_d$, $\delta_d$ and $\upsilon_d$. The symbols $\delta_d$ and $\upsilon_d$ are radial distances and $\rho_d$ is the density of the material in the annular space in the field of view of detector d. The distance $\upsilon_d$ is a function of two variables representing the minimum gap between the inner and outer conduits g and an angle $\phi$ representative of location of the tool inside the inner conduit. Thus the model can either be described as $f_{i,d}(\rho_d, \delta_d, \upsilon_d)$, or as $f_{i,d}(\rho_d, \phi, g)$.

Given a set of Monte Carlo simulation data for various values of $\rho_d$, $\phi$, and g, the model forms a linear system of equations. The matrix equation is given by:

$$r_{i,d} = H_d a_{i,d} \qquad (2)$$

where, $$r_{i,d} = [r_{i,d}^{(1)}, r_{i,d}^{(2)}, \ldots, r_{i,d}^{(N)}]^T \qquad (3)$$

$$a_{i,d} = [a_{000}, a_{100}, a_{010}, \ldots, a_{0p0}, a_{00p}]^T, \text{ and} \qquad (4)$$

$$H_d = \begin{bmatrix} 1 & \rho_{d,1} & \delta_d & \upsilon_d(\phi_1, g_1) & \rho_{d,1}\delta_d & \rho_{d,1}\upsilon_d(\phi_1, g_1) & \cdots & \rho_{d,1}^p & \delta_d^p & \upsilon_d^p(\phi_1, g_1) \\ 1 & \rho_{d,2} & \delta_d & \upsilon_d(\phi_2, g_2) & \rho_{d,2}\delta_d & \rho_{d,2}\upsilon_d(\phi_2, g_2) & \cdots & \rho_{d,2}^p & \delta_d^p & \upsilon_d^p(\phi_1, g_1) \\ \cdots & \cdots & \cdots & \cdots & & & & & & \\ \cdots & \cdots & \cdots & \cdots & & \cdots & & & & \\ \cdots & \cdots & \cdots & \cdots & & & & & & \\ 1 & \rho_{d,N} & \delta_d & \upsilon_d(\phi_N, g_N) & \rho_{d,N}\delta_d & \rho_{d,N}\upsilon_d(\phi_N, g_N) & \cdots & \rho_{d,N}^p & \delta_d^p & \upsilon_d^p(\phi_1, g_1) \end{bmatrix} \qquad (5)$$

with $r_{i,d}$ is a real number denoting a Monte Carlo simulated response of detector d in energy window i. The symbol T denotes transposition operator and N is the dimension of the vector $r_{i,d}$. It should be noted herein that the vector $r_{i,d}$ is acquired for a fixed set of N triplets $\{(\rho_d, \phi, g)_n,$ for n=1 to N$\}$. The dimension of $a_{i,d}$ is 1×K and the dimension of $H_d$ is N×K.

The polynomial coefficients are determined by solving the linear system of equations given by Equation (2). In one embodiment, a singular value decomposition of the matrix $H_d$ representing the well parameters is used to determine the least squares solution for the polynomial coefficients $a_{i,d}$. Alternate embodiments employ other techniques for determining the polynomial coefficients The method of determining the density values and $\phi$, and g includes selecting an objective function based on the detector data and the polynomial model 606. In one embodiment, the objective function is the squared error between the detector data and the polynomial function:

$$J(\rho_d, \phi, g) = (x_{i,d} - f_{i,d}(\rho_d, \phi, g))^2 \qquad (6)$$

where, $x_{i,d}$ is an observed detector response and $f_{i,d}$ is the modeled response. An optimization technique is used to minimize the objective function to provide estimates of $\rho_d$, $\phi$, and g 608. It should be noted herein that other objective functions may also be used in the optimization technique. In one embodiment, the minimization of the objective function is performed by a gradient descent method. The optimization problem is given by:

$$(\hat{\rho}_d, \hat{\phi}, \hat{g}) = \arg \cdot \min_{(\rho_d, \phi, g)} \cdot J(\rho_d, \phi, g) \qquad (7)$$

where, circumflex accent (^) represents estimate of an associated parameter obtained by the optimization technique. Other minimization methods such as recursive least squares and least mean square algorithm may be used in other exemplary embodiments.

In another exemplary embodiment, detector data from a plurality of detectors is used to determine the density of the material. In this embodiment, the matrix equation (2) is given by:

$$r_i = H a_i \qquad (8)$$

where, $$r_i = [r_{i,1} r_{i,2} \ldots r_{i,6}]^T, a_i = [a_{i,1} a_{i,2} \ldots a_{i,6}]^T \text{ and}$$
$$H = [H_1 H_2 \ldots H_6]^T \text{ with}$$

$r_{i,k}$ representing response of kth detector for the ith energy window, $a_{i,k}$ representing the coefficients of the polynomial model $f_{i,k}$. In one embodiment, the objective function for optimization is selected as:

$$J(\rho_1, \ldots \rho_6, \phi, g) = \sum_{d=1}^{6} (x_{i,d} - f_{i,d}(\rho_d, \phi, g))^2 \qquad (9)$$

where, $x_{i,d}$ is the detector data from detector d in energy window i and $f_{i,d}$ is the modeled detector data. The optimization minimizes the objective function of Equation (9) and determines six density values corresponding to the detector response from six detectors of the tool.

Figure 7:
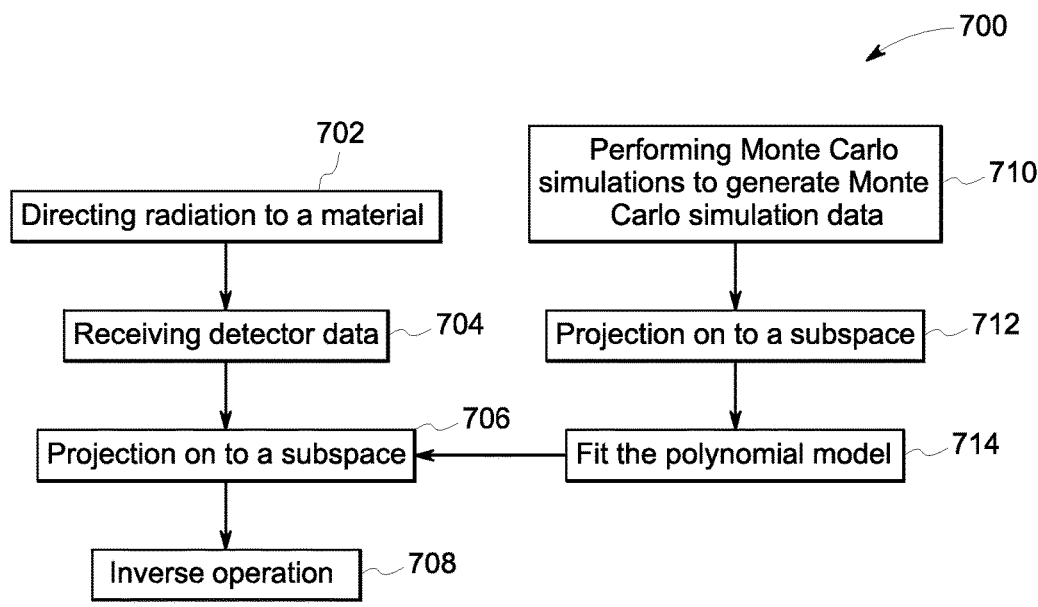
FIG. 7 is a flow chart of a method for estimating the density of the material using a principal component analysis model in accordance with an exemplary embodiment.

FIG. 7 is a flow chart 700 of a method for estimating the density of the material using a principal component analysis (PCA) model in accordance with an exemplary embodiment. The method includes directing radiation to a material in an annular space in a borehole of a subterranean fluid well as illustrated in step 702. In an exemplary embodiment, the radiation is a gamma radiation. Scattering events are generated from the interaction of the material in the annular space with radiation from the radiation source. The detector array having a plurality of detectors detect the scattered photons in multiple energy windows. The detector data is transmitted from the detector array to one or more computer processors 704. A set of Monte Carlo simulations are performed by the one or more processors. The set of Monte Carlo simulations are modeled based on the dimensions of the conduits, the composition of the conduits, the relative location of the tool with respect to the conduits, the geometry of the tool and a set of hypothetical materials of different densities filling the annular space and the space inside the inner conduit. In one exemplary embodiment, the set of Monte Carlo simulations generate Monte Carlo simulation data simulating the detector data corresponding to the well parameters of the tool and a set of hypothetical materials of different densities 710.

A subspace of the detector data is determined based on the Monte Carlo simulation data as described herein. A data matrix M having a dimension of N×3 is constructed using Monte Carlo simulation data corresponding to one of the plurality of detectors. The columns of the matrix M are simulated response values from the three energy windows and the rows represent responses for different combinations of parameter values ($\rho_d$, $\phi$, g). The subspace is determined by using principal component analysis of the data matrix M. In one embodiment, the principal component analysis is performed using a singular value decomposition of the matrix M as:

$$M = Q_1 \Sigma Q_2 \quad (10)$$

where, columns of $Q_2$ form a basis for the row space of M and the columns of $Q_1$ for a basis for the column space of M. The matrix $\Sigma$ representing a diagonal matrix having singular values as diagonal elements. The dimension of the matrices $Q_1$, $Q_2$, and $\Sigma$ are N×N, 3×3 and N×3 respectively. The matrix $Q_2$ has three column vectors corresponding to the three singular values. In other embodiments, the principal component analysis is performed using other techniques such as covariance method and spectral analysis methods. A subset of the plurality of singular vectors of the matrix $Q_2$ determines the subspace.

In one exemplary embodiment, the subspace corresponds to a span of the singular vector corresponding to the largest singular value. In another embodiment, the subspace corresponds to a span of two singular vectors corresponding to the two largest singular values. A matrix P having selected singular vectors as columns is a projection operator corresponding to the subspace. As an example, when a singular vector q corresponding to the largest singular value is considered, the projection operator P is equal to column vector q. The Monte Carlo simulation data is projected on to the subspace P in the step 712. The projected simulation data is given by $$Y(\rho_d) = Mq \quad (11)$$

where, Y is the projected simulation data with each row representing a point. It should be noted herein that techniques such as principal component analysis (PCA), independent component analysis (ICA), wavelet analysis, and frequency spectrum analysis may be used to determine an appropriate subspace. The projected simulation data is considered as a function of the density. A polynomial of suitable order is selected and a plurality of coefficients of the polynomial is determined based on the projected data 714. As an example the polynomial is represented by:

$$y(\rho_d) = c1\rho_d^3 + c2\rho_d^2 + c3\rho_d^1 + c4 \quad (12)$$

where, the constants $c_1$, $c_2$, $c_3$, and $c_4$ are determined based on the Monte Carlo simulation data and y representing projected data for known values of density parameter $\rho_d$. The determination of the plurality of coefficients is based on fitting of the polynomial to the projected data.

The detector data is projected on to the subspace 706 determined in the previous step 712. If the detector data is represented by a row vector $f_d$, the projected detector data is denoted by the matrix $f_d q$ to generate a projected data value y. An inverse operation is performed using the Equation (12) based on the projected data value y to determine an inverse image of the polynomial function. The inverse operation using the polynomial of Equation (12) determines an estimate of the density value 708.

In another embodiment, a plurality of detectors are used to estimate the density parameter of the material. The data matrix M is augmented by concatenating additional columns of detector data acquired by additional detectors. As an example, when two detectors are used, the dimension of the matrix M is N×6. The first three columns contain data from first detector for the three energy windows. The last three columns contain data from the second detector for three energy windows. In an exemplary embodiment, when six detectors are used, the dimension of the matrix M is N×18. In general, when D detectors are used, the dimension of the matrix is N×3D. The augmented data matrix M is used to generate a suitable linear subspace based on the principal component analysis as explained in previous paragraphs. One or more density estimates are determined within the linear subspace by in inverse operation.

Figure 8:
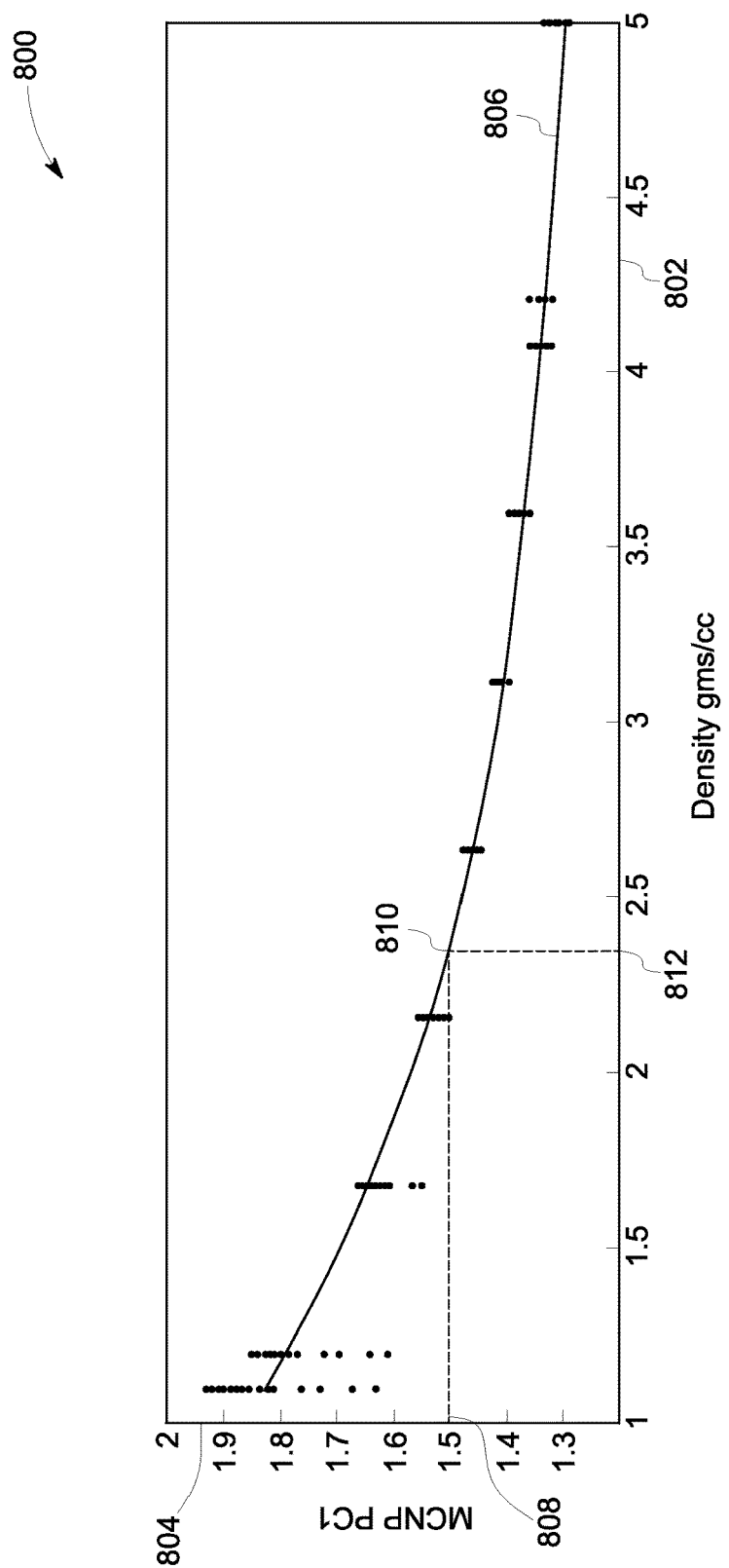
FIG. 8 is a graph illustrating relationship between the density of the material in the annular space of the well and the principal component of the detector data in accordance with an exemplary embodiment.

FIG. 8 is a graph 800 illustrating the relationship between the density of the material in the annular space of the well and the principal component of the detector data in accordance with an exemplary embodiment. The graph includes an x-axis 802 representative of density of the material. The graph also has a y-axis 804 representative of the value of the projected detector data. A curve 806 is graphical representative of the polynomial model generated based on the Monte Carlo simulation data as explained in the previous paragraph with reference to the FIG. 7. The curve corresponds to Equation (12) with $c_1 = -0.010715$, $c_2 = 0.1381$, $c_3 = -0.63911$, and $c_4 = 2.3764$. The inverse operation of the step 708 of FIG. 7 includes selecting a point 808 on the y-axis 804 corresponding to the projected detector data and identifying a point 810 on the curve 806 corresponding to the point 808. A point 812 is identified on the x-axis 802 corresponding to the point 810. The density value corresponding to the point 812 determines the density of the material in the annular space.

While only certain features of embodiments have been illustrated and described herein, many modifications and changes will occur to those skilled in the art. It is, therefore, to be understood that the appended embodiments are intended to cover all such modifications and changes as falling within the spirit of the invention.

What is claimed is:

1. A system for estimating the density of a material in an annular space, the system comprising:
   (a) a physical tool configured to be accommodated within and move within a channel of an inner conduit disposed within an outer conduit, the inner conduit and the outer conduit together defining an annular space containing a material characterized by one or more densities, the physical tool comprising a radiation source and a plurality of radiation detectors, the radiation detectors being configured to detect scattered photons resulting from interaction of the material in the annular space with radiation from the radiation source;

(b) a data transmission device coupled to the plurality of radiation detectors and configured to transmit detector data; and (c) one or more computer processors linked to the data transmission device and configured to receive the detector data, the one or more computer processors generating a set of Monte Carlo simulations based on the geometry of the inner and outer conduits, the composition of the inner and outer conduits, the relative location of the physical tool with respect to the inner and outer conduits, the geometry of the physical tool and a set of hypothetical materials of different densities, the one or more computer processors being configured to perform a principal component analysis on the set of Monte Carlo simulations to generate a principal component analysis model of the detector data, the one or more computer processors being configured to apply the principal component analysis model to the detector data to estimate the density of the material in the annular space at one or more locations within the annular space based upon the principal component analysis model and the detector data using an optimization technique.

2. The system according to claim 1, wherein the plurality of radiation detectors is characterized by a plurality of energy windows.

3. The system according to claim 2, wherein the plurality of radiation detectors is configured to detect count rate data in multiple energy windows simultaneously.

4. The system according to claim 1, wherein the well parameters comprise inner and outer diameters of the inner and outer conduits and the radius of the physical tool.

5. The system according to claim 1, wherein the principal component analysis is performed by computing a singular value decomposition of the Monte Carlo simulation data and detector data.

6. The system according to claim 1, wherein the principal component analysis identifies a subspace defined by at least one principal component.

7. The system according to claim 6, wherein the one or more computer processors are configured to project the Monte Carlo simulation data onto a subspace determined by the principal components.

8. The system according to claim 7, wherein the one or more computer processors are configured to determine a polynomial fit of the projected Monte Carlo simulation data where the polynomial is a function of the density of the material in the annulus.

9. The system according to claim 8, wherein the one or more computer processors are configured to determine an inverse image of the polynomial function based on the detector data, wherein the inverse image is an estimate of the density.

10. The system according to claim 6, wherein the one or more computer processors are configured to project the detector data onto a subspace determined by the principal components.

11. A method for estimating the density of a material in an annular space, the method comprising:

(a) receiving detector data, from a plurality of radiation detectors, representative of scattered photons resulting from interaction of a material in an annular space with radiation from a radiation source and detected by the plurality of radiation detectors, wherein the radiation source and the plurality of radiation detectors is part of a physical tool configured to be accommodated within and move within a channel of an inner conduit disposed within an outer conduit, the inner conduit and the outer conduit together defining the annual space;

(b) transmitting, by a data transmission device coupled to the plurality of radiation detectors, the detector data to one or more computer processors; the one or more computer processors being configured for:

(i) performing a set of Monte Carlo simulations based on the geometry of the inner and outer conduits, the composition of the inner and outer conduits, the relative location of the physical tool with respect to the inner and outer conduits, the geometry of the physical tool and a set of hypothetical materials of different densities filling the annular space and the space inside the inner conduit;

(ii) performing a principal component analysis on the set of Monte Carlo simulations to generate a principal component analysis model of the detector data;

(iii) applying the principal component analysis model to the detector data; and (iv) estimating the density of the material in the annular space at one or more locations within the annular space based upon the principal component analysis model and the detector data using an optimization technique;

(c) receiving, by the one or more computer processors, one or more estimated densities of the material in the annular space.

12. The method according to claim 11, wherein the plurality of radiation detectors operates in a plurality of energy windows.

13. The method according to claim 12, wherein the detector data comprises count rate data generated in multiple energy windows simultaneously.

14. The method according to claim 11, wherein the well parameters comprise inner and outer diameters of the inner and outer conduits and the radius of the physical tool.

15. The method according to claim 11, wherein the principal component analysis is performed by computing a singular value decomposition of the detector data.

16. The method according to claim 11, wherein the principal component analysis identifies a subspace defined by at least one principal component.

17. The method according to claim 16, wherein the applying comprises projecting the Monte Carlo simulation data onto a subspace determined by the principal components.

18. The method according to claim 17, wherein the estimating comprises determining a polynomial fit of the projected Monte Carlo simulation data where the polynomial is a function of the density of the material in the annulus.

19. The method according to claim 18, wherein the estimating comprises determining an inverse image of the polynomial function given detector data.

20. A non-transitory computer readable medium having instructions to enable one or more computer processors to:

(a) receive detector data, from a plurality of radiation detectors, representative of scattered photons resulting from interaction of a material in an annular space with radiation from a radiation source and detected by the plurality of radiation detectors, wherein the radiation source and the plurality of radiation detectors is part of a physical tool configured to be accommodated within and move within a channel of an inner conduit disposed within an outer conduit, the inner conduit and the outer conduit together defining the annular space;

(b) transmit, by a data transmission device coupled to the plurality of radiation detectors, the detector data to the one or more computer processors; the one or more computer processors being configured for:
  (i) performing a set of Monte Carlo simulations based on the geometry of the inner and outer conduits, the composition of the inner and outer conduits, the relative location of the physical tool with respect to the inner and outer conduits, the geometry of the physical tool and a set of hypothetical materials of different densities filling the annular space and the space inside the inner conduit;
  (ii) performing a principal component analysis on the set of Monte Carlo simulations to generate a principal component analysis model of the detector data;
  (iii) applying the principal component analysis model to the detector data;
  (iv) estimating the density of the material in the annular space at one or more locations within the annular space based upon the principal component analysis model and the detector data using an optimization technique; and
(c) receive, by the one or more computer processors, one or more estimated densities of the material in the annular space.

* * * * *